United States Patent
Park

(10) Patent No.: US 9,391,170 B2
(45) Date of Patent: Jul. 12, 2016

(54) THREE-DIMENSIONAL FIELD-EFFECT TRANSISTOR ON BULK SILICON SUBSTRATE

(71) Applicant: Broadcom Corporation, Irvine, CA (US)

(72) Inventor: Chang Seo Park, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 268 days.

(21) Appl. No.: 13/973,107

(22) Filed: Aug. 22, 2013

(65) Prior Publication Data

US 2015/0054079 A1 Feb. 26, 2015

(51) Int. Cl.
*H01L 21/00* (2006.01)
*H01L 29/66* (2006.01)
*H01L 21/84* (2006.01)
*H01L 29/78* (2006.01)
*H01L 27/12* (2006.01)

(52) U.S. Cl.
CPC ........ *H01L 29/66795* (2013.01); *H01L 21/845* (2013.01); *H01L 27/1211* (2013.01); *H01L 29/785* (2013.01)

(58) Field of Classification Search
CPC ............ H01L 29/66795; H01L 21/845; H01L 29/785; H01L 27/1211
See application file for complete search history.

(56) References Cited

U.S. PATENT DOCUMENTS

| 8,816,421 B2 * | 8/2014 | Hui | H01L 29/66825 257/316 |
| 2013/0175618 A1 * | 7/2013 | Cheng | H01L 21/823431 257/347 |

OTHER PUBLICATIONS

Fried, D., "FinFET tipsheet for IEDM," accessed from www.techdesignforums.com/practice/technique/finfet-iedm-tipsheet, posted Dec. 4, 2012; 9 pages.
Mendez, H. et al., "Comparing SOI and bulk FinFETs: Performance, manufacturing variability, and cost," accessed from www.electroiq.com/articles/sst/print/volume-52/issue-11/features/Cover_Article/Comparing_SOI_and_bulk_FinFETs_Performance_manufacturing_variability_and_cost.html, posted Nov. 1, 2009; 7 pages.

* cited by examiner

*Primary Examiner* — Laura Menz
(74) *Attorney, Agent, or Firm* — Sterne, Kessler, Goldstein & Fox P.L.L.C.

(57) ABSTRACT

A field-effect transistor (FET) on bulk substrate and a method of fabricating the same is discussed herein. The FET includes a dielectric layer disposed on the bulk substrate and a fin structure and a gate structure disposed on the dielectric layer. The dielectric layer includes alternating first and second dielectric regions. The fin structure includes a channel region interposed between a source region and a drain region. The gate structure is capacitively coupled to the fin structure and positioned between the source region and the drain region. Improved performance characteristics of FET is primarily achieved with the dielectric layer providing electrical isolation of the fin structure from the bulk substrate.

25 Claims, 6 Drawing Sheets

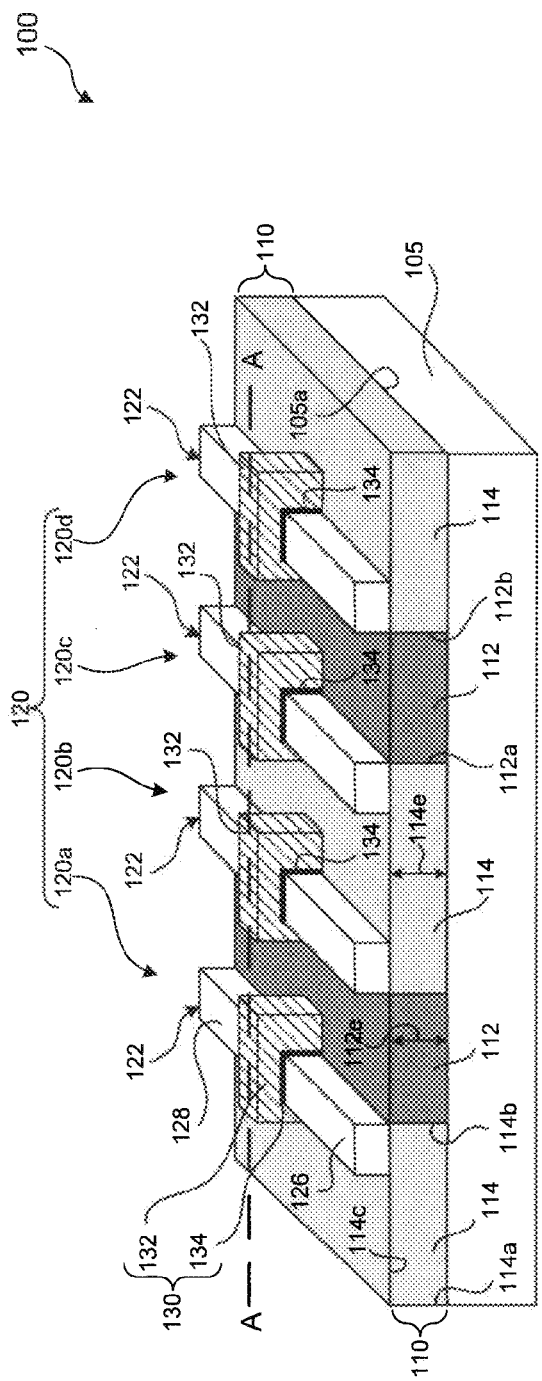
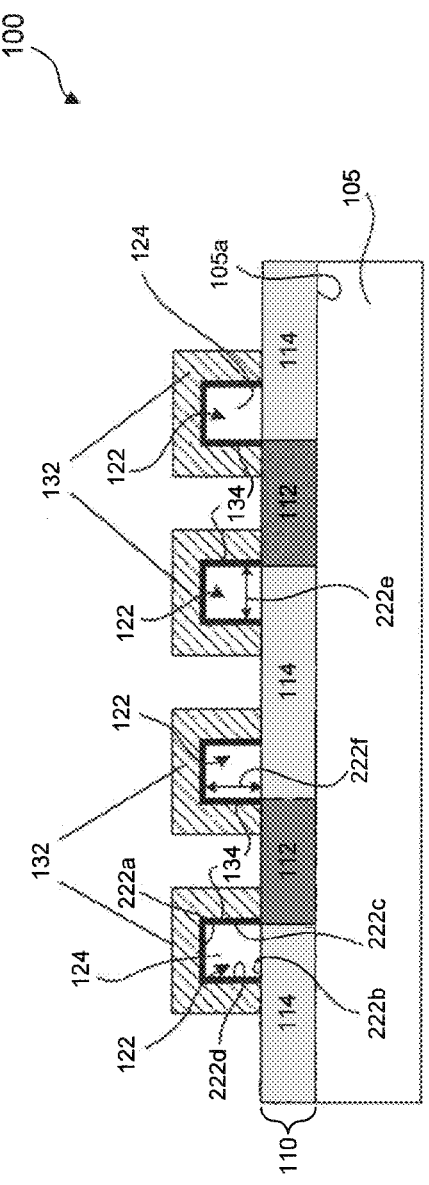
FIG. 1
FIG. 2

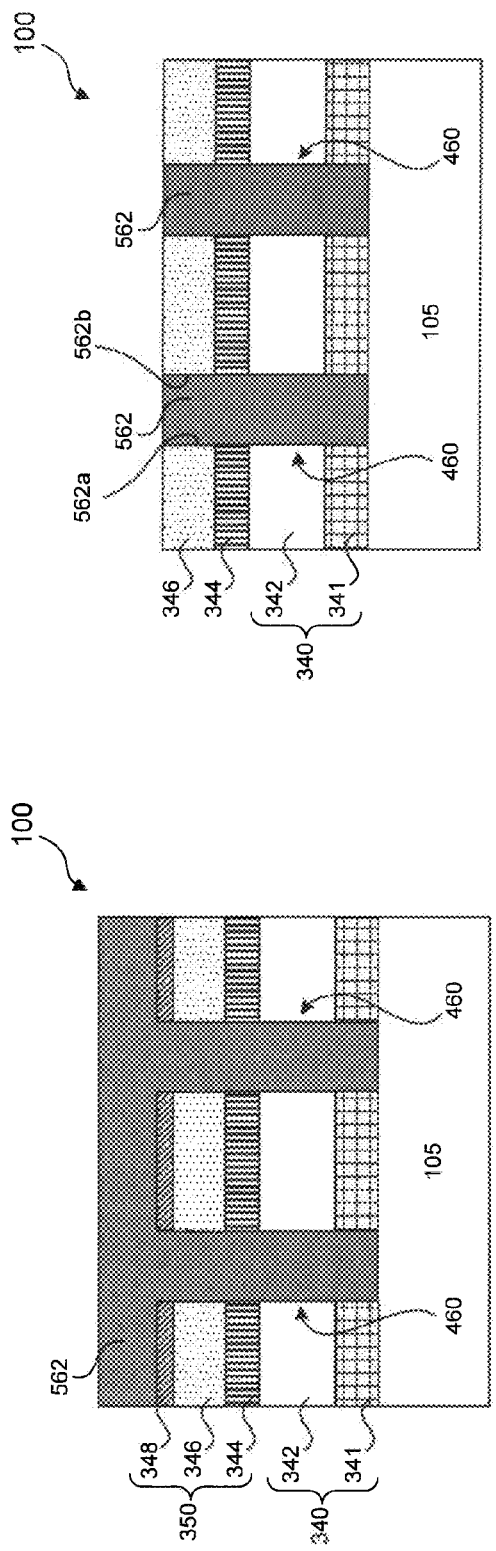

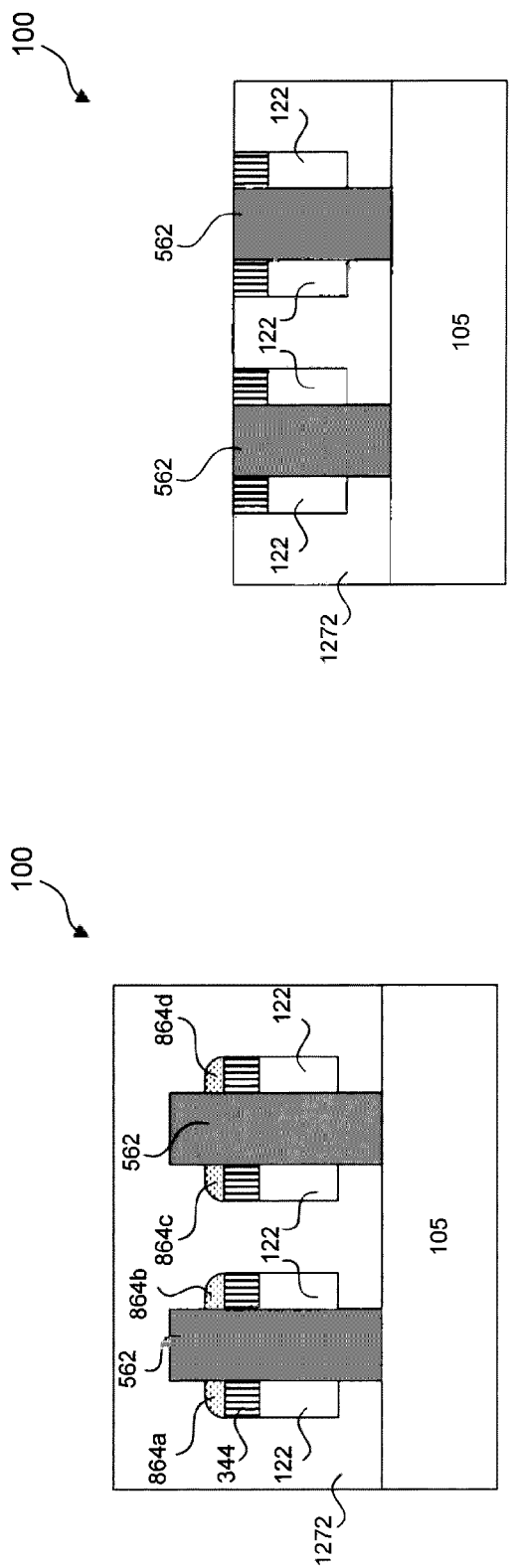
FIG. 13
FIG. 12
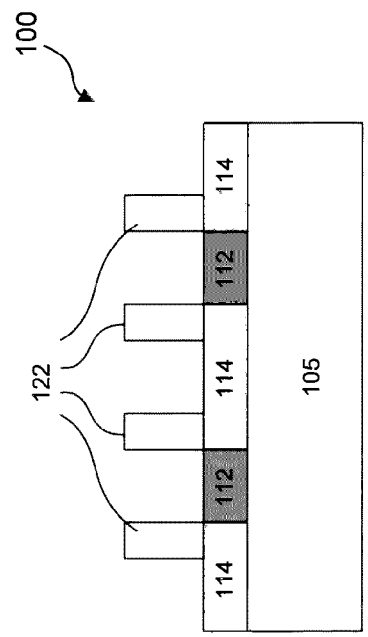
FIG. 14

US 9,391,170 B2

THREE-DIMENSIONAL FIELD-EFFECT TRANSISTOR ON BULK SILICON SUBSTRATE

BACKGROUND

1. Field of the Disclosure

The present disclosure generally relates to semiconductor devices including three-dimensional (3D) field effect transistors (FETs).

2. Background Art

With the advance in semiconductor technology, there has been increasing demand for higher storage capacity, faster processing systems, and high speed communication systems. To meet these demands, the semiconductor industry continues to scale down dimension of FETs, and also increase packing density of FETs on an integrated circuit (IC) to accommodate a larger number of FETs on an IC. However, this approach of scaling down and closely packing of FETs on ICs has limitations. The scaling down of devices to smaller dimensions can introduce short channel effects. In addition, closely spaced FETs may suffer from disturbances such as electron leakage, noise coupling, or electrostatic coupling. These limitations can degrade the operating characteristics and performance of the FETs over time.

To overcome such limitations, transition from planar FET to non-planar, e.g., 3D FET architecture has been considered. Relative to planar FETs, 3D FETs offer improved channel control and therefore, reduced short channel effects. These non-planar FETs are 3D structures having vertical structures (also referred as "fins") as the transistor body and they are generally referred as 3D FETs or FinFETs. While a channel region in a planar FET is within the substrate with a gate structure placed above the channel region, the channel region of a 3D FET is placed above the substrate with a gate structure wrapped around the channel region, providing better gate control of the 3D FET current. There are two current 3D FET process flows: one based on silicon-on-insulator (SOI) substrates, and another based on bulk silicon substrates.

BRIEF DESCRIPTION OF THE DRAWINGS/FIGURES

The accompanying drawings illustrate the present disclosure and, together with the description, further serve to explain the principles of the disclosure and to enable one skilled in the pertinent art to make and use the disclosure.

FIG. 1 illustrates a schematic of a device according to an embodiment.

FIG. 2 illustrates a cross-sectional view along line A-A of the device of FIG. 1 according to an embodiment.

FIGS. 3-14 illustrate cross-sectional views of a device at select stages of its fabrication process, according to an embodiment.

Figure 4:
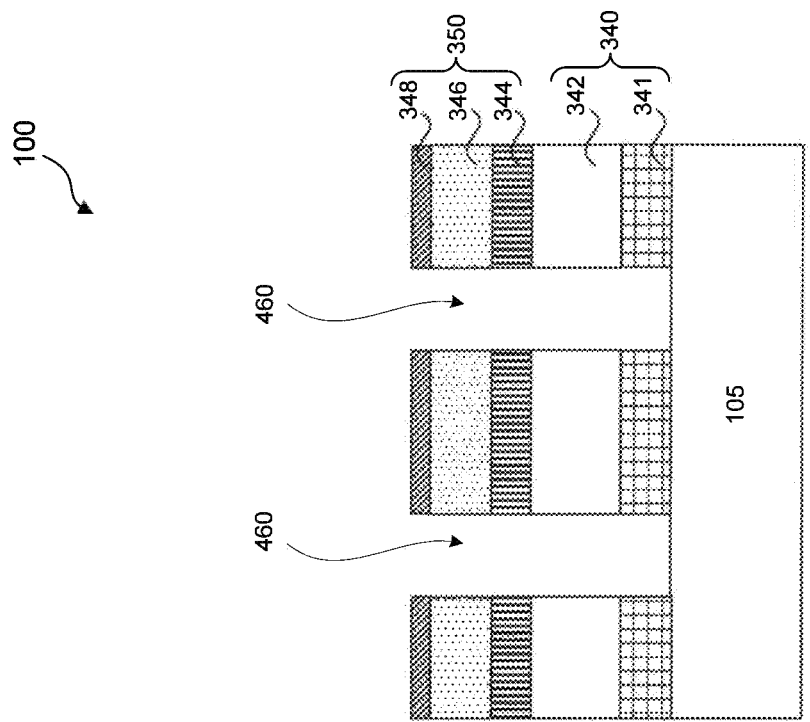

The present disclosure will now be described with reference to the accompanying drawings. In the drawings, like reference numbers generally indicate identical, functionally similar, and/or structurally similar elements. The drawing in which an element first appears is indicated by the leftmost digits) in the reference number.

DETAILED DESCRIPTION OF THE DISCLOSURE

The following Detailed Description refers to accompanying drawings to illustrate one or more embodiments consistent with the present disclosure. The disclosed embodiment(s) merely exemplify the disclosure. The embodiment(s) described, and references in the specification to "one embodiment," "an embodiment," "an example embodiment," "an example of this embodiment," etc., indicate that the embodiment(s) described may include a particular feature, device, or characteristic, but every embodiment may not necessarily include the particular feature, device, or characteristic. Moreover, such phrases are not necessarily referring to the same embodiment. Further, when a particular feature, device, or characteristic is described in connection with an embodiment, it is within the knowledge of those skilled in the relevant art(s) to effect such feature, device, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner.

The embodiments described herein are provided for illustrative purposes, and are not limiting. Other embodiments are possible, and modifications can be made to the embodiments within the spirit and scope of the present disclosure. Therefore, the Detailed Description is not meant to limit the present disclosure. Rather, the scope of the present disclosure is defined only in accordance with the following claims and their equivalents.

The following Detailed Description of the embodiments will so fully reveal the general nature of the present disclosure that others can, by applying knowledge of those skilled in relevant art(s), readily modify and/or adapt for various applications such embodiments, without undue experimentation, without departing from the spirit and scope of the disclosure. Therefore, such adaptations and modifications are intended to be within the meaning and plurality of equivalents of the embodiments based upon the teaching and guidance presented herein.

It is to be understood that the phraseology or terminology herein is for the purpose of description and not of limitation, such that the terminology or phraseology of the present specification is to be interpreted by those skilled in relevant art(s) in light of the teachings herein.

Those skilled in the relevant art(s) will recognize that this description may be applicable to many various devices, and should not be limited to any particular type of device. Before describing the various embodiments in more detail, further explanation shall be given regarding certain terms that may be used throughout the descriptions.

In embodiments, the term "etch" or "etching" or "etchback" generally describes a fabrication process of patterning a material, such that at least a portion of the material remains after the etch is completed. For example, generally the process of etching a semiconductor material involves the steps of patterning a masking layer (e.g., photoresist or a hard mask) over the semiconductor material, subsequently removing areas of the semiconductor material that are no longer protected by the mask layer, and optionally removing remaining portions of the mask layer. Generally, the removing step is conducted using an "etchant" that has a "selectivity" that is higher to the semiconductor material than the mask layer. As such, the areas of semiconductor material protected by the mask would remain after the etch process is complete. However, the above is provided for purposes of illustration, and is not limiting. In another example, etching may also refer to a process that does not use a mask, but still leaves behind at least a portion of the material after the etch process is complete.

The above description serves to distinguish the term "etching" from "removing." In an embodiment, when etching a material, at least a portion of the material remains behind after the process is completed. In contrast, when removing a material, substantially all of the material is removed in the process. However, in other embodiments, 'removing' may incorporate etching.

In an embodiment, the term "selectivity" between two materials is described as the ratio between the etch rates of the two materials under the same etching conditions. For example, an etchant with a selectivity of 3:1 to the semiconductor material over the mask layer means that the etchant removes the semiconductor material at a rate three times faster than that at which it removes the mask layer.

In an embodiment, the terms "deposit" or "dispose" describe the act of applying a layer of material to the substrate. Such terms are meant to describe any possible layer-forming technique including, but not limited to, thermal growth, sputtering, evaporation, chemical vapor deposition, atomic layer deposition, epitaxial growth, electroplating, etc.

In an embodiment, the term "substrate" describes a material onto which subsequent material layers are added. In embodiments, the substrate itself may be patterned and materials added on top of it may also be patterned, or may remain without patterning. Furthermore, "substrate" may be any of a wide array of semiconductor materials such as silicon, germanium, gallium arsenide, indium phosphide, etc. In other embodiments, the substrate may be electrically non-conductive such as a glass or sapphire wafer.

In an embodiment, the term "substantially perpendicular," in reference to a topographical feature's sidewall, generally describes a sidewall disposed at an angle ranging between about 85 degrees and 90 degrees with respect to the substrate.

In an embodiment, "substantially in contact" means the elements or structures in substantial contact can be in physical contact with each other with only a slight separation from each other. It should be understood that relative spatial descriptions between one or more particular features, structures, or characteristics (e.g., "vertically aligned," "contact," etc.) used herein are for purposes of illustration only, and that practical implementations of the structures described herein may include fabrication and/or misalignment tolerances without departing from the spirit and scope of the present invention.

In an embodiment, devices fabricated in and/or on the substrate may be in several regions of the substrate, and these regions may not be mutually exclusive. That is, in some embodiments, portions of one or more regions may overlap.

Unless otherwise indicated, the drawings provided throughout the disclosure should not be interpreted as to-scale drawings.

A Device according to an Embodiment

FIG. 1 illustrates a schematic of a device 100 according to an embodiment. Device 100 may include a substrate 105, a dielectric layer 110, and FETs 120 including FETs 120a-120d. FETs 120 may also be referred as 3D FETs 120 or FinFETs 120 by a person of skill in the art. It should be noted that device 100 is shown in FIG. 1 as including only four FETs 120a-120d for the sake of simplicity. However, as would be understood by a person of skill in the art based on the description herein, device 100 may include any number of FETs similar to FETs 120a-120d. In addition, device 100 may include other devices and functional units that are not shown for the sake of simplicity.

Substrate 105 may be a bulk semiconductor substrate comprising a bulk semiconductor material such as, but not limited to, silicon, germanium, gallium arsenide, indium phosphide, or any combination thereof, according to various examples of this embodiment. Bulk semiconductor material of substrate 105 may be implanted with p-type carriers to be a p-type bulk substrate, according to an example embodiment. The p-type carriers may be provided by p-type materials, such as, but not limited boron. Alternatively, substrate 105 may be an n-type substrate formed by implanting in bulk semiconductor material of substrate 105 n-type carriers that are provided by n-type materials, such as, but not limited to, phosphorus.

In an embodiment, dielectric layer 110 may be disposed over and in substantial contact with a top surface 105a of substrate 105. Dielectric layer 110 may include dielectric regions 112 and dielectric regions 114 that are arranged in an alternating configuration, according to an example of this embodiment. Bottom surfaces 112b and 114b of dielectric regions 112 and 114, respectively, may be in substantial contact with top surface 105a of substrate 105. Sidewalls 112a and 112b of dielectric regions 112 may be in substantial contact with sidewalls 114b and 114a of dielectric regions 114, respectively. In an example of this embodiment, dielectric regions 112 and 114 may comprise vertical dimensions 112e and 114e, respectively, that are approximately equal to each other. Alternatively, vertical dimensions 112e of dielectric region 112 may be smaller or greater than vertical dimension 114e of dielectric region 114. Dielectric regions 112 and 114 may comprise materials that are similar or different from each other. The materials used to form dielectric regions 112 and 114 may be silicon nitride, silicon oxide, or any other suitable dielectric material, according to various examples of this embodiment.

In another embodiment, FETs 120a-120d may each comprise a fin structure 122 and a gate structure 130 that is partially wrapped around fin structure 122. While FETs 120a-120d are shown here to be similar in structure and function, in alternate embodiments FETs 120a-120d may each have a distinct fin structure or a gate structure with respect to each other. Fin structure 122 may be a vertical structure having an approximate rectangular cross-section disposed on and in substantial contact with top surface 114c of dielectric region 114. Dielectric regions 112 and 114 of dielectric layer 110 may provide electrical isolation to fin structure 122 from substrate 105 and adjacent fin structures or devices. In an example of this embodiment, fin structure 122 may be formed from an epitaxial layer disposed on substrate 105 and then electrically isolated from substrate 105 by dielectric region 114 through subsequent processing, as described below with reference to FIGS. 3-14.

According to an example of this embodiment, fin structure 122 may include a channel region (not shown in FIG. 1; a cross-sectional view of channel region 224 shown in FIG. 2) and doped regions 126 and 128. In an embodiment, channel region may be interposed between doped regions 126 and 128 and positioned under gate structure 130. Channel region may be configured to provide a conductive path between doped regions 126 and 128, in an embodiment. Doped region 126 may be used as a source/drain region, and similarly, doped region 128 may be used as a source/drain region. It is understood by a skilled artisan that the source and drain regions of FETs 120a-120d may be interchangeable and are named based on voltage values applied to doped regions 126 and 128. Doped regions 126 and 128 may be configured to be n-type or p-type for p-type or n-type doped channel region of fin structure 122, respectively. Alternatively, channel region may be undoped for p-type or n-type doped regions 126 and 128. In an example, n-type channel region of fin structure 122 or n-type doped regions 126 and 128 may be formed by doping fin structure 122, for example, by ion implantation with n-type carriers using n-type materials, such as, but not limited to, arsenic. In another example, p-type channel region or p-type doped regions 126 and 128 may be formed by doping fin structure 122, for example, by ion implantation with p-type carriers using p-type materials, such as, but not limited to, boron. The carrier concentrations in doped regions 126 and 128 may be higher than the carrier concentration in channel region to form heavily doped regions 126 and 128. Generally, doping a material with a comparatively large doping concentration of carriers equal or greater than $10^{19}/cm^3$, refers to a doping that is high or heavy.

Gate structure 130 may include a gate layer 132 and a gate oxide layer 134, according to an example of this embodiment. Gate layer 132 may be disposed over and in substantial contact with gate oxide layer 134. Gate oxide layer 134 may be partially wrapped around and in substantial contact with channel region of fin structure 122. The material used to form gate layer 132 may be, for example, doped polysilicon or metal and the material for forming gate oxide layer 134 may be, for example, an oxide, a nitride, a high-k dielectric, or any combination thereof, according to various examples of this embodiment. While gate oxide layer 134 is shown in FIG. 1 as a single layer, in alternate embodiments gate layer 134 may include a plurality of dielectric layers.

FIG. 2 illustrates a cross-sectional view of device 100 along line A-A, according to an embodiment. In an example of this embodiment, gate oxide layer 134 of gate structure 130 partially wraps around channel region 224 of fin structure 122 and is in substantial contact with top surface 222a and sidewalls 222c and 222d of fin structure 122. In another example, bottom surfaces 232a and 232b of gate layer 132 may be in substantial contact with dielectric regions 112 and 114, respectively. Yet in another example, bottom surfaces 234a and 234b of gate oxide layer 134 may be in in substantial contact with dielectric regions 112 and 114, respectively. It should be noted that only a wrap around gate structure 130 is described herein for the sake of simplicity. However, FETs 120 of device 100 may include other types of gate structures disposed on fin structures 122. For example, dual independent gate structures may be fabricated on fin structures 122 of FETs 120 (not shown). The dual independent gate structures may be formed, for example, by disposing a vertical gate structure along each sidewall 222c and 222d of fin structure 122.

In an embodiment, a lateral dimension 222e between sidewalls 222c and 222d of fin structure 122 may be referred as fin width of fin structure 122 and a vertical dimension 222f between top surface 222a and bottom surface 222b of fin structure 122 may be referred as fin height of fin structure 122. Fin structure 122 may be formed to have a fin width ranging from about 10 nm-15 nm. While fin height of all fin structures 122 of device 100 are shown here to be approximately equal, it should be understood that device 100 may each have fin structures with varying fin heights.

In an example operation of FETs 120, current may flow through fin structures 122 between doped regions 126 and 128 by applying a first and second voltage to doped regions 126 and 128, respectively, and a gate voltage to gate structure 130. This current may be referred as the drain current. The relative magnitude of first and second voltage applied to doped regions 126 and 128 and the direction of drain current in fin structure 122 may be dependent on configuration of FETs 120 in a similar manner as current planar FETs. The gate voltage may control the magnitude of the drain current by controlling conductivity of channel region 224 that provides a conductive path between doped regions 126 and 128, according to an embodiment. Such conductivity control of channel region 224 by gate voltage is possible because charge carrier concentration in channel region 224 is primarily dependent on relative voltage between gate voltage and voltage applied to doped region 126 or 128, depending which doped region is used as the source region. Thus, relative change in gate voltage with respect to voltage at doped region 126 or 128 may control charge carrier concentration in channel region 224 and consequently, conductivity of channel region 224.

It is to be appreciated that any substantial leakage of the drain current through substrate 105 may be prevented by dielectric regions 112 and 114 of dielectric layer 110. Preventing drain current from leaking through substrate 105 while flowing between doped regions 126 and 128 may provide more precise drain current control by gate structure 130. Thus, FETs 120 fabricated on substrate 105 may provide comparable or better performance characteristics with respect to current SOI based 3D FETs. But, FETs 120 may have an advantage of cost effectiveness over current SOI based 3D FETs. The cost effectiveness may be primarily due to the use of bulk silicon substrate 105 in the fabrication of FETs 120, as described above according to an embodiment, instead of SOI substrates. SOI substrates are, for example, about three times more costly than bulk silicon substrates.

Current bulk silicon based 3D FETs have been fabricated to overcome such limitation of SOI based 3D FETs. But FETs 120 may provide improved performance characteristics with respect to current bulk silicon based 3D FETs. The fin structures of current silicon based 3D FETs are fabricated from the bulk silicon substrate and additional processing steps are performed to isolate adjacent fin structures and decouple source and drain regions of fin structures that are connected through the bulk silicon substrate. However, the current techniques applied for such fin structure isolation results in degraded performance characteristics. For example, highly doped silicon region is formed under the fin structures of current bulk silicon based 3D FETs for decoupling of source and drain regions. But, this highly doped silicon region results in high dopant concentration in the channel region, high junction capacitance and leakage current, which negatively affects the performance characteristics of the current bulk silicon based 3D FETs. Thus, FETs 120 fabricated on silicon 105 may be able to achieve cost effectiveness over SOI based 3D FETs without significant degradation in their performance characteristics.

For the sake of simplicity, FETs 120 of device 100 have been described here as including only single fin structure 122. However, as would be understood by a person skill in the art, FETs 120 may each include a plurality of fin structures similar to fin structure 122. One end of these plurality of fin structures may be coupled to a common source contact region and the other end of these plurality of fin structures may be coupled to a common drain contact region. In addition, FETs 120 may include a common gate structure coupled to these plurality of fin structures.

An Example Method for Fabricating a Device According to an Embodiment

FIGS. 3-14 illustrate an example fabrication process for forming device 100 shown in FIGS. 1 and 2, according to an embodiment.

Figure 3:
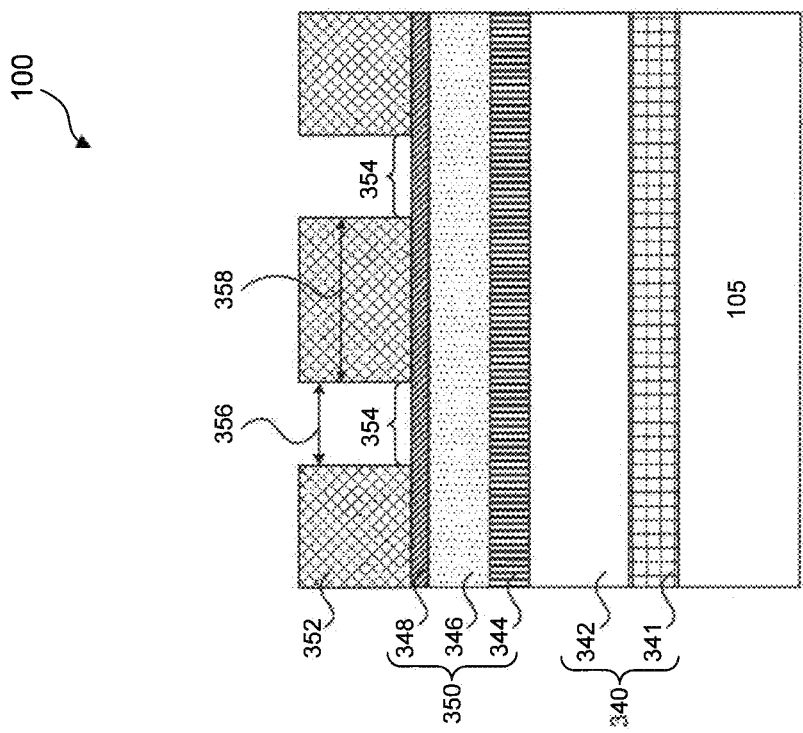

FIG. 3 illustrates a cross-sectional view of a partially fabricated device 100 after formation of trench etch areas 354 on a stack of masking layer 350 disposed on a stack of epitaxial layers 340 grown on substrate 105, according to an embodiment. Trench etch areas 354 may be formed by patterning of a photoresist layer 352 disposed on stack of masking layers 350, as shown in FIG. 3. Trench etch areas 354 may be formed with lateral dimensions 356 about 30 nm and a lateral distance 358 between them about 60 nm. Patterning of photoresist layer 352 may be performed by standard photolithography and etching processes.

As shown in FIG. 3, stack of masking layer 350 may comprise a first hard mask layer 344, an organic layer 346, and a second hard mask layer 348, according to an example of this embodiment. First hard mask layer 344 may be disposed on stack of epitaxial layers 340, for example, by depositing a layer of nitride such as silicon nitride using current deposition methods such as, but not limited to, chemical vapor deposition (CVD) or atomic layer deposition (ALD). Organic layer 346 may be disposed on first hard mask layer 344, for example, by spin casting polymer materials with high carbon content or by depositing amorphous carbon layer using current deposition methods such as, but not limited to, chemical vapor deposition (CVD) or sputter deposition. Second hard mask layer 348 may be disposed on organic layer 346 in a similar manner as first hard mask layer 344. The relative thickness of first and second hard mask layers 344 and 348 with respect to each other may be equal or different, according to various embodiments. Thickness of first hard mask layer 344 may range from about 20 nm-30 nm and thickness of organic layer 346 may be about 100 nm, according to different examples of this embodiment.

Further, as shown in FIG. 3, stack of epitaxial layers 340 may comprise a sacrificial epitaxial layer 341 and an epitaxial layer 342, according to an example of this embodiment. Sacrificial epitaxial layer 341 may be disposed on substrate 105, for example, by growing a silicon germanium layer from substrate 105, assuming substrate 105 to be silicon substrate, using any suitable epitaxial growth techniques for silicon germanium. The deposition of sacrificial epitaxial layer 341 may be followed by a deposition of epitaxial layer 342. Epitaxial layer 342 may be disposed on sacrificial layer 341, for example, by growing a silicon epitaxial layer on silicon germanium layer of sacrificial epitaxial layer 341, using any suitable silicon epitaxial growth techniques. According to an embodiment, the epitaxial growth of sacrificial layer 341 and epitaxial layer 342 may be a single epitaxial growth of silicon layer from substrate 105, assuming substrate 105 to be silicon substrate, with germanium atoms being introduced during the growth of sacrificial epitaxial layer 341 to obtain silicon germanium layer. Thickness of sacrificial epitaxial layer 341 may range from about 15 nm-30 nm and thickness of epitaxial layer 342 may define vertical dimension $222f$ of fin structure 122 and may range from about 30 nm-50 nm, according to different examples of this embodiment.

FIG. 4 illustrates a cross-sectional view of a partially fabricated device 100 after formation of trenches 460 on substrate 105 in trench etch areas 354 as described previously with reference to FIG. 3, according to an embodiment. The patterned photoresist layer 352 may assist in guiding the formation of trenches 460 in trench etch areas 354. Trenches 460 may be formed by any current etching methods suitable for etching the materials of stack of masking layers 350 and stack of epitaxial layers 340. For example, a dry etch process such as, but not limited to, reactive ion etching (RIE) may be performed to remove the materials of stack of masking layers 350 and stack of epitaxial layers 340 for the formation of trenches 460, according to an embodiment. The etching process may be performed to selectively etch the materials of stack of masking layers 350 and stack of epitaxial layers 340 in trench etch areas 354 without significant etching or removal of patterned photoresist layer 352. This selective etching may be done by employing an etchant that has higher selectivity to the materials of stack of masking layers 350 and stack of epitaxial layers 340 than to the material of photoresist layer 352. The formation of trenches 460 may be followed by removal of photoresist layer 352 by using any current photoresist removal method. During the removal of photoresist layer 352, second hard mask layer 348 may act as an etch-stop layer and prevent removal of organic layer 346.

FIGS. 5-7 illustrate cross-sectional views of partially fabricated device 100 during filling of trenches 460, according to an embodiment. The filling of trenches 460 may comprise a deposition process followed by a polishing process. The deposition process may be performed by depositing a layer 562 of dielectric material similar to the material of dielectric region 112, as described with reference to FIG. 1, over the partially fabricated device 100 of FIG. 4. Layer 562 may be deposited such that at least trenches 460 may be filled, as shown in FIG. 5. The deposition of layer 562 may be performed using any current deposition methods suitable for dielectric materials. For example, dielectric materials such as, but not limited to, silicon oxide or silicon nitride may be deposited for layer 562 using a CVD or an ALD process. Following the deposition of layer 562, a chemical mechanical polishing (CMP) process may be performed to remove layer 562 from any areas except for trenches 460 and also to remove second hard mask layer 348, as shown in FIG. 6. During the CMP process, organic layer 346 may act as a polishing stop layer and layer 562 may be polished down to organic layer 346 such that layer 562 in trenches 460 and organic layer 346 may be coplanarized. Following the formation of dielectric layer 562 in trenches 460, organic layer 346 may be selectively etched without significant etching or removal of underlying first hard mask layer 344, as shown in FIG. 7.

Figure 8:
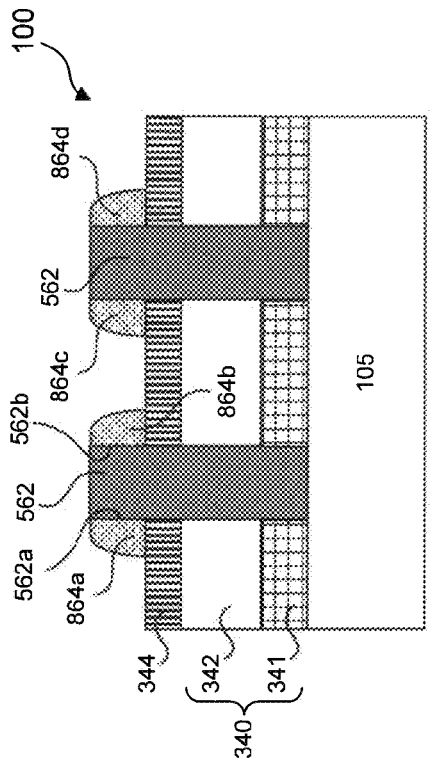
Figure 9:
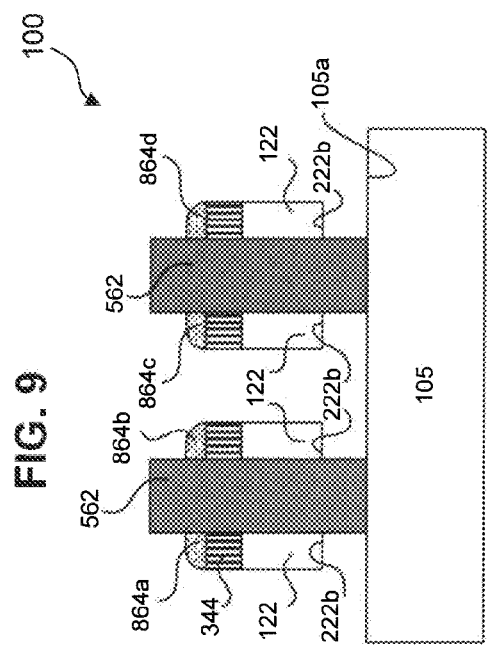

FIGS. 8-9 illustrate cross-sectional views of partially fabricated device 100 during formation of spacer masks 864a-864d, according to an embodiment. The formation of spacer masks 864a-864d may comprise a deposition process followed by an etch-back process. The deposition process may be performed by depositing a spacer mask layer 864 over the partially fabricated device 100 of FIG. 7. Spacer layer mask layer 864 may be disposed using a conformal deposition process, such as, but not limited to, CVD or plasma enhanced CVD (PECVD). The material used for space mask layer 864 may be, for example, silicon oxide or silicon nitride. The deposited thickness 866 of spacer mask layer 864 along sidewalls 562a and 562b of dielectric layer 562 extending out of trench 460 may be about 15 nm and may define lateral dimension 222e of fin structure 122.

Following the deposition of spacer mask layer 864, an etch mask may be disposed on spacer mask layer 864 and patterned (not shown). As shown in FIG. 9, following an etch-back process through etch mask, spacer masks 864a-864d may be formed. The formed spacer masks 864a-864d may each have a cross-sectional view that comprises a perimeter having a curved portion, as shown in FIG. 9, according to an embodiment. The curved portions of spacer masks 864a-864d may result from increased corner erosion during the etch-back process and from the anisotropy of dry etchants typically used in the etch back process.

Figure 10:
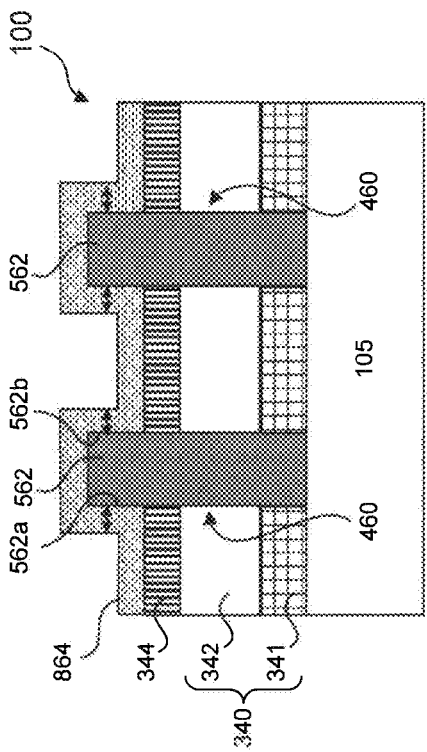
Figure 11:
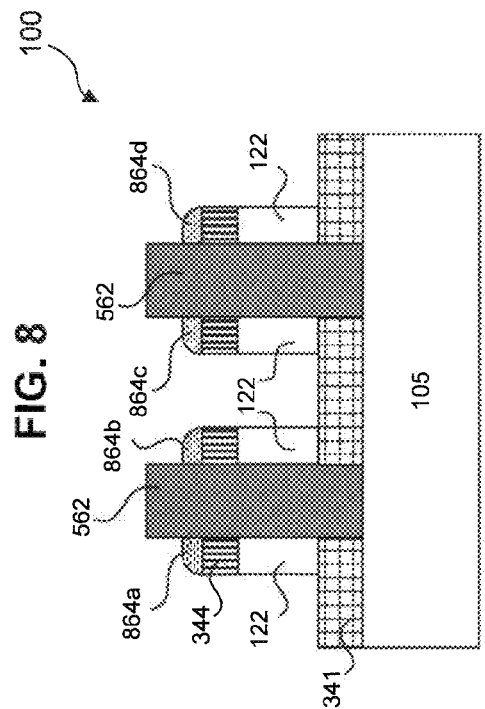

FIGS. 10-11 illustrate cross-sectional views of partially fabricated device 100 during formation of fin structure 122, according to an embodiment. Following formation of spacer masks 864a-864d, first hard mask layer 344 and epitaxial layer 342 may be etched through spacer masks 864a-864d to form fin structures 122 as shown in FIG. 10. Etching may be performed using, for example, a dry etch process such as, but not limited to, reactive ion etching (RIE), according to an embodiment. Formation of fin structures 122 may be followed by removal of sacrificial epitaxial layer 341 that may result in open spaces between bottom surfaces 222b of fin structures 122 and top surface 105a of substrate 105, as shown in FIG. 11. Sacrificial epitaxial layer 341 may be removed, for example, by any current wet etching methods such as, but not limited to RCA standard clean 2 using a mixture of hydrochloric acid, hydrogen peroxide and water.

FIGS. 12-14 illustrate cross-sectional views of partially fabricated device 100 during formation of dielectric regions 112 and 114 of dielectric layer 110, according to an embodiment. As shown in FIG. 12, dielectric layer 1272 comprising a material similar to the material of dielectric region 114, as described above with reference to FIG. 1, may be disposed on partially fabricated device 100 of FIG. 11. Dielectric layer may be disposed using deposition process such as, but not limited to, CVD or ALD. Such deposition processes may allow for conformal deposition of dielectric layer 1272 on all exposed surfaces of partially fabricated device 100 of FIG. 11. Deposition of dielectric layer 1272 may be followed by another CMP process to polish down dielectric layer 1272, space masks 864a-864d and dielectric layer 562 to first hard mask layer 344. In the process of such polishing, space masks 864a-864d may be removed and dielectric layers 562 and 1272 may be coplanarized with first hard mask layer 344 as shown in FIG. 13. The CMP process may be followed an etch back process to remove first hard mask layer 344 and to yield dielectric regions 112 and 114 as shown in FIG. 14.

In an embodiment, following the formation of dielectric regions 112 and 114, additional fabrication steps (not shown) may be carried out to fabricate gate structures 130 and doped regions 126 and 128 in order to yield device 100 as shown in FIGS. 1 and 2. These additional steps may be similar to that used in forming gate structures and dopes regions in current 3D FETs.

It should be understood that the various layers illustrated daring the example fabrication process of device 100 are not necessarily drawn to scale. In addition, the above description is meant to provide a general overview of select steps involved in forming device 100 shown in FIGS. 1 and 2, and that, in actual practice, more features and/or fabrication steps may be performed additionally or alternatively to that described herein to form device 100, as would be understood by one skilled in the art given the description herein.

Example Steps for Fabricating a Device According to an Embodiment

Figure 15:
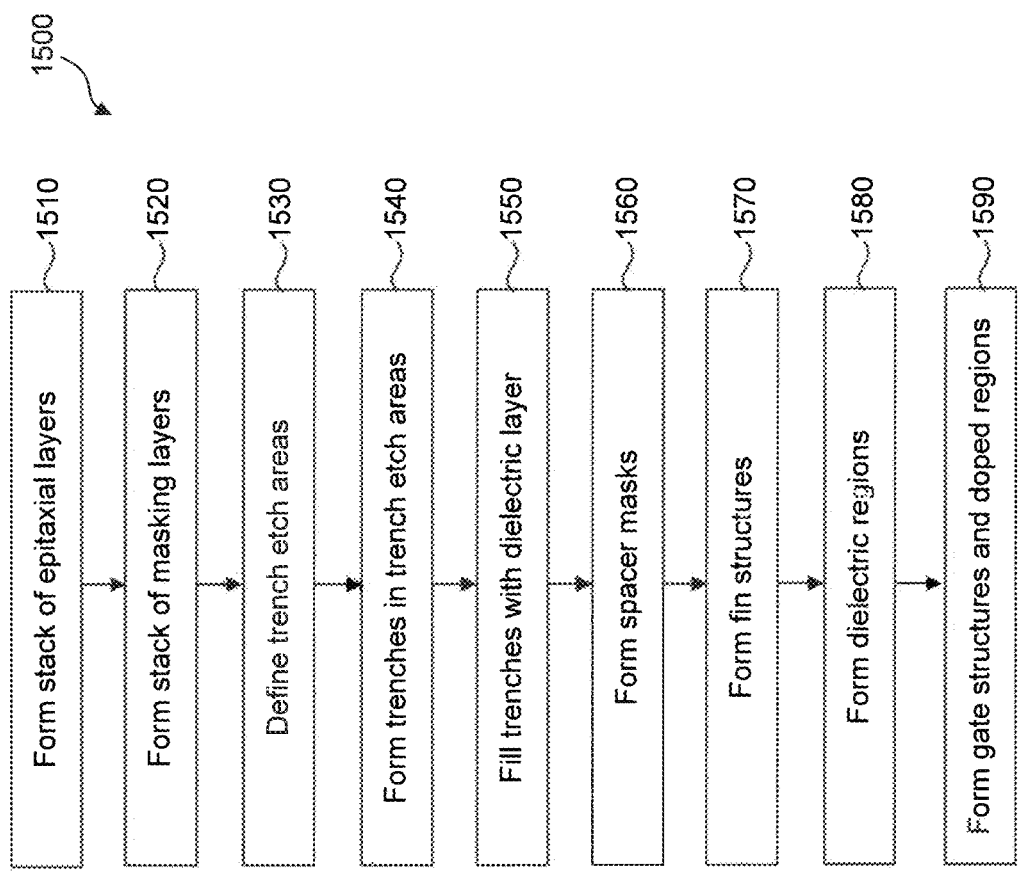
FIG. 15 illustrates a flowchart for a method of fabricating a device, according to an embodiment.

FIG. 15 illustrates a flowchart for a method of fabricating device 100 as shown in FIGS. 1 and 2, according to an embodiment. Solely for illustrative purposes, the steps illustrated in FIG. 15 will be described with reference to example fabrication process illustrated in FIGS. 3-14. Steps may performed in a different order or not performed depending on specific applications.

In step 1510, a stack of epitaxial layers 340 is formed on substrate 105 as shown in FIG. 3. Stack of epitaxial layers 340 may be formed by depositing a sacrificial epitaxial layer 341 on substrate 105 followed by a deposition of epitaxial layer 342 on sacrificial layer 341. According to an embodiment, sacrificial layer 341 and epitaxial layer 342 may be deposited by a single epitaxial growth of silicon layer from substrate 105, assuming substrate 105 to be silicon substrate. During the growth of sacrificial epitaxial layer 341 germanium atoms may be introduced to obtain silicon germanium layer as sacrificial layer 341.

In step 1520, a stack of masking layers 350 is formed on stack of epitaxial layers 340 as shown in FIG. 3. Stack of masking layer 350 may be formed by depositing a first hard mask layer 344 on stack of epitaxial layers 340, followed by a deposition of an organic layer 346 on first hard mask layer 344, and a subsequent deposition of a second hard mask layer 348 on organic layer 346. First and second hard mask layers 344 and 346 may be formed, for example, by depositing a layer of nitride such as silicon nitride using current deposition methods such as, but not limited to, CVD or ALD. Organic layer 346 may be disposed, for example, by spin casting polymer materials with high carbon content or by depositing amorphous carbon layer using current deposition methods such as, but not limited to, CVD or sputter deposition.

In step 1530, trench etch areas 354 is defined as shown in FIG. 3. The defining of trench etch areas 354 may be done by patterning a photoresist layer 352 disposed on stack of masking layers 350. Patterning of photoresist layer 352 may be performed by standard photolithography and etching processes.

In step 1540, trenches 460 are formed in trench etch areas 354, as shown in FIG. 4. Trenches 460 may be formed, for example, by a dry etch process such as, but not limited to, reactive ion etching (RIE) to remove the materials of stack of masking layers 350 and stack of epitaxial layers 340. The etching process may be performed to selectively etch the materials of stack of masking layers 350 and stack of epitaxial layers 340 in trench etch areas 354 without significant etching or removal of patterned photoresist layer 352.

In step 1550, trench 460 is filled with a dielectric layer as shown in FIG. 7. The filling of trenches 460 may be performed by depositing a layer 562 of dielectric material similar to the material of dielectric region 112, followed by a chemical mechanical polishing (CMP) process to remove layer 562 from any areas except for trenches 460 and to remove second hard mask layer 348, as described above with reference to FIG. 6. During the CMP process, organic layer 346 may act as a polishing stop layer and layer 562 may be polished down to organic layer 346 such that layer 562 in trenches 460 and organic layer 346 may be coplanarized. The deposition of layer 562 may be performed using, for example, a CVD or an ALD process.

In step 1560, spacer masks 864a-864d are formed as shown in FIG. 9. The formation of spacer masks 864a-864d may be done by depositing a spacer mask layer 864 such as silicon oxide or silicon nitride followed by an etch-back process to form spacer masks 864a-864d, as described above with reference to FIGS. 8 and 9. The deposition of space mask layer 864 may be performed using, for example, a CVD or a PECVD process.

In step 1570, fin structures 122 are defined as shown in FIG. 10. Fin structures 122 may be defined by etching first hard mask layer 344 and epitaxial layer 342 through spacer masks 864a-864d using, for example, a dry etch process such as, but not limited to, an RIE process, as described above with reference to FIG. 10.

In step 1580, dielectric regions 112 and 114 are formed as shown in FIG. 14. Dielectric regions 112 and 114 may be formed by an etch back process performed on dielectric layers 562 in trenches 460 and dielectric layer 1272, as described above with reference to FIGS. 12-14. The etch back process may be any suitable etching technique for dielectric materials. For example, a dry etch process such as, but not limited to, RIE may be used to etch back and form dielectric regions 112 and 114.

In step 1590, gate structures 130 and doped regions 126 and 128 are formed as shown in FIGS. 1 and 2. Gate structures 130 and doped regions 126 and 128 may be formed using standard fabrication methods of forming gate structures and doped regions in current 3D FETs.

It should be noted that the above method and related figures describe fabricating only FETs 120a-120d for the sake of simplicity. However, as would be understood by a person of skilled in the art based on the description herein, the above steps may be applied to fabricate any number of such FETs.

Those skilled in the relevant art(s) will recognize that the above method 1500 may additionally or alternatively include any of the steps or sub-steps described above with respect to FIGS. 1-14, as well as any of their modifications. Further, the above description of the example method 1500 should not be construed to limit the description of device 100 described above.

It is to be appreciated that the Detailed Description section, and not the Summary and Abstract sections (if any), is intended to be used to interpret the claims. The Summary and Abstract sections (if any) may set forth one or more but not all embodiments of the present disclosure as contemplated by the inventor(s), and thus, are not intended to limit the present disclosure or the appended claims in any way.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

The breadth and scope of the present disclosure should not be limited by any of the above-described embodiments, but should be defined only in accordance with the following claims and their equivalents.

What is claimed is:

1. A device comprising:
   a dielectric layer on a substrate, the dielectric layer comprising:
   first dielectric regions comprising a first dielectric material, and
   second dielectric regions comprising a second dielectric material that is different from the first dielectric material, the first dielectric regions and the second dielectric regions being in substantial contact with the substrate,
   wherein the first and second dielectric regions are positioned in an alternating pattern on the substrate;
   vertical structures, positioned on the dielectric layer, comprising first doped regions and second doped regions; and
   control structures positioned on the dielectric layer between the first doped regions and the second doped regions.

2. The device of claim 1, wherein the first dielectric regions are substantially in contact with the second dielectric regions.

3. The device of claim 1, wherein each of the vertical structures is configured to be electrically isolated from adjacent ones of the vertical structures by one of the first dielectric regions or one of the second dielectric regions.

4. The device of claim 1, wherein:
   the device comprises a plurality of fin field effect transistors (finFETs);
   the vertical structures comprise fin structures of the plurality of finFETs; and
   the control structures comprise gate structures of the plurality of finFETs.

5. The device of claim 1, wherein the vertical structures comprise vertical channel regions between the first doped regions and the second doped regions.

6. The device of claim 1, wherein the vertical structures are positioned on the first dielectric regions.

7. The device of claim 1, wherein vertical dimensions of the first dielectric regions are approximately equal to vertical dimensions of the second dielectric regions.

8. The device of claim 1, wherein:
   first surfaces of the control structures are substantially in contact with the first dielectric regions; and
   second surfaces of the control structures are substantially in contact with the second dielectric regions.

9. The device of claim 1, wherein the substrate comprises a bulk semiconductor material.

10. The device of claim 1, wherein the alternating pattern comprises:
    a first sidewall of a first dielectric region from among the first dielectric regions is in substantial contact with a second sidewall of a second dielectric region from among the second dielectric regions; and
    a third sidewall of the second dielectric region is in substantial contact with a fourth sidewall of a third dielectric region from among the first dielectric regions.

11. The device of claim 10, wherein the first sidewall, the second sidewall, the third sidewall, and the fourth sidewall extend in a direction normal to the substrate.

12. The device of claim 10, wherein the vertical structures contact the second dielectric regions.

13. The device of claim 12, wherein first surfaces of the vertical structures only contact the second dielectric regions.

14. A device comprising:
    a dielectric layer on a substrate, the dielectric layer comprising:
    a first dielectric region comprising a first dielectric material, and
    a second dielectric region comprising a second dielectric material that is different from the first dielectric material, the first dielectric region and the second dielectric region being in substantial contact with the substrate,
    wherein the first and second dielectric regions are positioned in an alternating pattern on the substrate;
    a vertical structure, positioned on the dielectric layer, comprising a first doped region and a second doped region; and
    a control structure positioned on the dielectric layer between the first doped region and the second doped region.

15. The device of claim 14, wherein the first dielectric region is substantially in contact with the second dielectric region.

16. The device of claim 14, wherein:
    the device comprises a fin field effect transistor (finFET);
    the vertical structure comprises a fin structure of the finFET; and
    the control structure comprises a gate structure of the finFET.

17. The device of claim 14, wherein the vertical structure comprises a vertical channel region between the first doped region and the second doped region.

18. The device of claim 14, wherein the vertical structure is positioned on the first dielectric region.

19. The device of claim 14, wherein a vertical dimension of the first dielectric region is approximately equal to a vertical dimension of the second dielectric region.

20. The device of claim 14, wherein:
 a first surface of the control structure is substantially in contact with the first dielectric region; and
 a second surface of the control structure is substantially in contact with the second dielectric region.

21. The device of claim 14, wherein the substrate comprises a bulk semiconductor material.

22. The device of claim 14, wherein the alternating pattern comprises:
 a first sidewall of the first dielectric region is in substantial contact with a second sidewall of the second dielectric region.

23. The device of claim 22, wherein the first sidewall and the second sidewall are in a direction normal to the substrate.

24. The device of claim 14, wherein the vertical structure contacts the second dielectric region.

25. The device of claim 24, wherein a first surface of the vertical structure only contacts the second dielectric region.

* * * * *